(12) United States Patent
Kajiwara et al.

(10) Patent No.: US 12,477,769 B2
(45) Date of Patent: Nov. 18, 2025

(54) SEMICONDUCTOR DEVICE IN WHICH CURRENT COLLAPSE AND LEAKAGE CURRENT BETWEEN SOURCE AND DRAIN REGIONS ARE SUPPRESSED

(71) Applicant: KABUSHIKI KAISHA TOSHIBA, Tokyo (JP)

(72) Inventors: Yosuke Kajiwara, Yokohama (JP); Masahiko Kuraguchi, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 651 days.

(21) Appl. No.: 17/652,167

(22) Filed: Feb. 23, 2022

(65) Prior Publication Data

US 2023/0022819 A1 Jan. 26, 2023

(30) Foreign Application Priority Data

Jul. 26, 2021 (JP) .................... 2021-121245

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 30/476* (2025.01); *H10D 62/824* (2025.01); *H10D 62/8503* (2025.01)

(58) Field of Classification Search
CPC ........... H01L 29/66462; H01L 29/7786; H01L 29/7787; H10D 30/475; H10D 30/4755; H10D 30/476
See application file for complete search history.

(56) References Cited

U.S. PATENT DOCUMENTS 10,109,727 B2    10/2018   Oyama et al.
11,476,336 B2 *  10/2022   Ono .................... H01L 29/4236
                          (Continued)

FOREIGN PATENT DOCUMENTS

JP    2008-84942 A    4/2008
JP    2010-56137 A    3/2010
                (Continued)

*Primary Examiner* — Jesse Y Miyoshi
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, a nitride region, and a first insulating member. The third electrode includes a first electrode portion. The first electrode portion is between the first electrode and the second electrode. The first semiconductor region includes first to sixth partial regions. The fourth partial region is between the first and third partial regions. The fifth partial region is between the third and second partial regions. The sixth partial region is between the fifth and second partial regions. The second semiconductor region includes first and second semiconductor portions. The second semiconductor portion is in contact with the fifth partial region. The nitride region includes a first nitride portion being in contact with the sixth partial region. The first insulating member includes a first insulating region between the third partial region and the first electrode portion.

21 Claims, 7 Drawing Sheets

(51) Int. Cl.
*H10D 62/824* (2025.01)
*H10D 62/85* (2025.01)

(56) References Cited

U.S. PATENT DOCUMENTS

| | | | |
|---|---|---|---|
| 2007/0158692 A1* | 7/2007 | Nakayama | H01L 29/7787 |
| | | | 257/E29.255 |
| 2010/0052015 A1 | 3/2010 | Sato | |
| 2011/0068371 A1* | 3/2011 | Oka | H01L 29/66462 |
| | | | 257/E29.188 |
| 2011/0089468 A1* | 4/2011 | Zhang | H01L 29/4236 |
| | | | 257/E29.246 |
| 2014/0091363 A1* | 4/2014 | Jeon | H01L 29/7786 |
| | | | 257/194 |
| 2016/0268219 A1* | 9/2016 | Furukawa | H01L 21/02271 |
| 2018/0097096 A1 | 4/2018 | Sugiyama et al. | |
| 2020/0105917 A1 | 4/2020 | Okita et al. | |
| 2020/0335587 A1 | 10/2020 | Ono et al. | |
| 2022/0045202 A1* | 2/2022 | Kajiwara | H01L 29/2003 |
| 2022/0262939 A1* | 8/2022 | Chang | H01L 29/66462 |

FOREIGN PATENT DOCUMENTS

| | | |
|---|---|---|
| JP | 2012-109366 A | 6/2012 |
| JP | 2014-7389 A | 1/2014 |
| JP | 5764543 B2 | 8/2015 |
| JP | 2016-127089 A | 7/2016 |
| JP | 2016-171260 A | 9/2016 |
| JP | 2018-60847 A | 4/2018 |
| JP | 2020-53585 A | 4/2020 |
| JP | 2020-178068 A | 10/2020 |
| JP | 2022-30079 A | 2/2022 |

\* cited by examiner

SEMICONDUCTOR DEVICE IN WHICH CURRENT COLLAPSE AND LEAKAGE CURRENT BETWEEN SOURCE AND DRAIN REGIONS ARE SUPPRESSED

CROSS-REFERENCE TO RELATED APPLICATIONS

This application is based upon and claims the benefit of priority from Japanese Patent Application No. 2021-121245, filed on Jul. 26, 2021; the entire contents of which are incorporated herein by reference.

FIELD

Embodiments described herein generally relate to a semiconductor device.

BACKGROUND

For example, in a semiconductor device such as a transistor, stable characteristics are desired.

DETAILED DESCRIPTION

Figure 1:
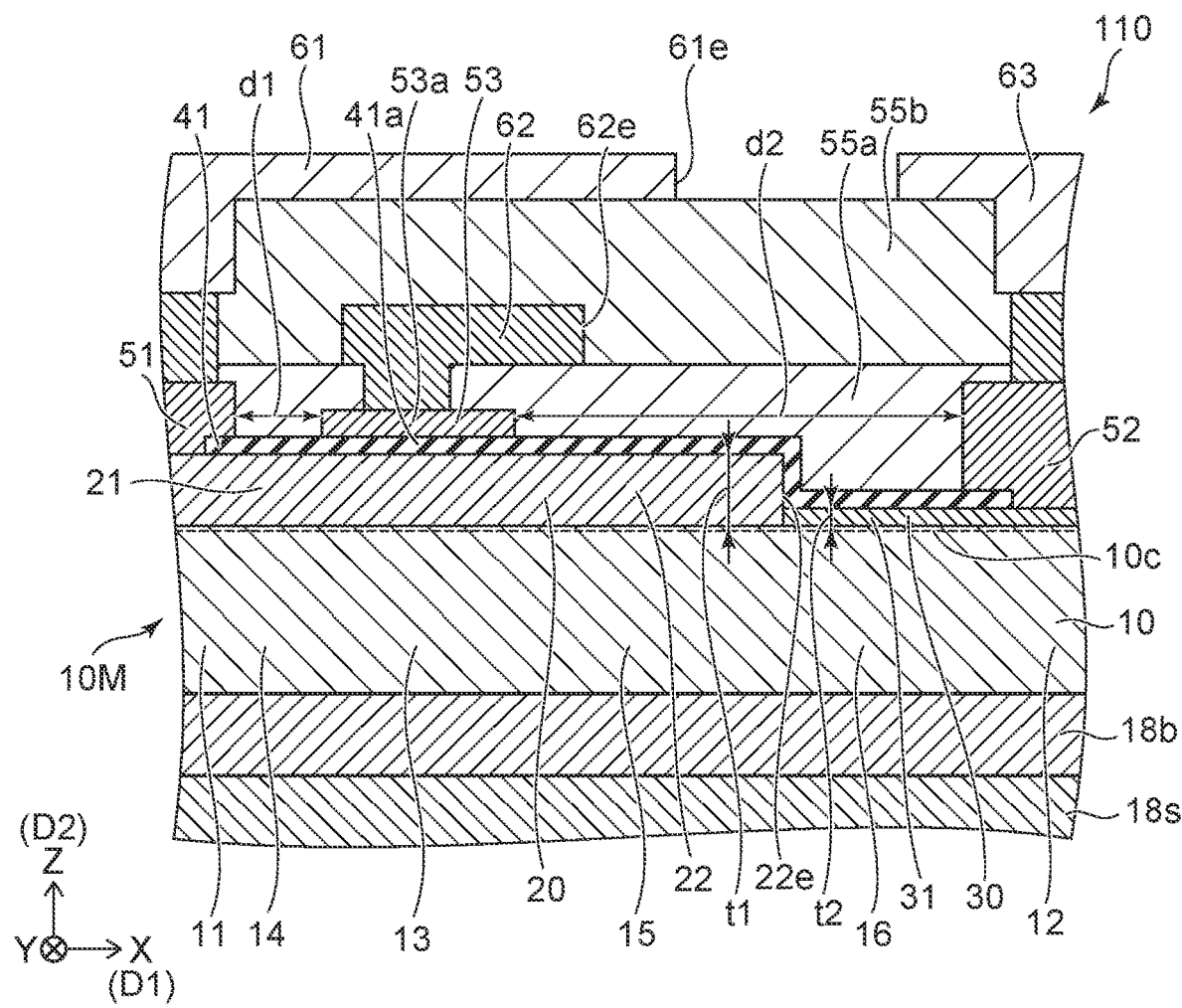
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a nitride region, and a first insulating member. A direction from the first electrode to the second electrode is along a first direction. The third electrode includes a first electrode portion. A position of the first electrode portion in the first direction is between a position of the first electrode in the first direction and a position of the second electrode in the first direction. The first semiconductor region includes $Al_{x1}Ga_{1-x1}N$ ($0 \leq x1 \leq 1$). The first semiconductor region includes a first partial region, a second partial region, a third partial region, a fourth partial region, a fifth partial region, and a sixth partial region. A direction from the first partial region to the first electrode is along a second direction crossing the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. A position of the sixth partial region in the first direction is between the position of the fifth partial region in the first direction and the position of the second partial region in the first direction. The second semiconductor region includes $Al_{x2}Ga_{1-x2}N$ ($x1 < x2 < 1$). The second semiconductor region includes a first semiconductor portion, and a second semiconductor portion. A direction from the fourth partial region to the first semiconductor portion is along the second direction. A direction from the fifth partial region to the second semiconductor portion is along the second direction. The second semiconductor portion is in contact with the fifth partial region. The nitride region includes $Al_{y1}Ga_{1-y1}N$ ($x2 < y1 \leq 1$). The nitride region includes a first nitride portion. A direction from the sixth partial region to the first nitride portion is along the second direction. The first nitride portion is in contact with the sixth partial region. A direction from the second semiconductor portion to the first nitride portion is along the first direction. The first insulating member includes a first insulating region. The first insulating region is between the third partial region and the first electrode portion in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, a semiconductor device 110 according to the embodiment includes a first electrode 51, a second electrode 52, a third electrode 53, a first semiconductor region 10, a second semiconductor region 20, a nitride region 30, and a first insulating member 41.

A direction from the first electrode 51 to the second electrode 52 is along a first direction D1. The first direction D1 is an X-axis direction. One direction perpendicular to the X-axis direction is defined as a Z-axis direction. The direction perpendicular to the X-axis direction and the Z-axis direction is defined as a Y-axis direction.

The third electrode 53 includes a first electrode portion 53a. A position of the first electrode portion 53a in the first direction D1 is between a position of the first electrode 51 in the first direction D1 and a position of the second electrode 52 in the first direction D1.

The first semiconductor region 10 includes $Al_{x1}Ga_{1-x1}N$ ($0 \leq x1 < 1$). The composition ratio x1 is, for example, not less than 0 and less than 0.1. The first semiconductor region 10 includes, for example, GaN.

The first semiconductor region 10 includes a first partial region 11, a second partial region 12, a third partial region 13, a fourth partial region 14, a fifth partial region 15, and a sixth partial region 16. A direction from the first partial region 11 to the first electrode 51 is along a second direction D2. The second direction D2 crosses the first direction D1. The second direction D2 is, for example, the Z-axis direction.

A direction from the second partial region 12 to the second electrode 52 is along the second direction D2. A direction from the third partial region 13 to the first electrode portion 53a is along the second direction D2. In the second direction D2, the region overlapping the first electrode 51 corresponds to the first partial region 11. In the second direction D2, the region overlapping the second electrode 52 corresponds to the second partial region 12. In the second direction D2, the region overlapping the first electrode portion 53a corresponds to the third partial region 13.

A position of the fourth partial region 14 in the first direction D1 is between a position of the first partial region 11 in the first direction D1 and a position of the third partial region 13 in the first direction D1. A position of the fifth partial region 15 in the first direction D1 is between the position of the third partial region 13 in the first direction D1 and a position of the second partial region 12 in the first direction D1. A position of the sixth partial region 16 in the first direction D1 is between the position of the fifth partial region 15 in the first direction D1 and the position of the second partial region 12 in the first direction D1. The boundaries between the first to sixth partial regions 11 to 16 may be clear or unclear.

The second semiconductor region 20 includes $Al_{x2}Ga_{1-x2}N$ (x1<x2<1). The composition ratio x2 is, for example, not less than 0.1 and not more than 0.35. The second semiconductor region 20 includes, for example, AlGaN.

The second semiconductor region 20 includes a first semiconductor portion 21 and a second semiconductor portion 22. A direction from the fourth partial region 14 to the first semiconductor portion 21 is along the second direction D2. A direction from the fifth partial region 15 to the second semiconductor portion 22 is along the second direction D2. The second semiconductor portion 22 is in contact with the fifth partial region 15. In this example, a part of the second semiconductor region 20 is between the third partial region 13 and the first electrode portion 53a. The boundary between the first semiconductor portion 21 and the second semiconductor portion 22 may be clear or unclear.

The first semiconductor region 10 and the second semiconductor region 20 are included in the semiconductor member 10M.

The nitride region 30 includes $Al_{y1}Ga_{1-y1}N$ (x2<y1≤1). The composition ratio y1 is, for example, not less than 0.8 and not more than 1. The nitride region 30 includes, for example, AlGaN or AlN. The nitride region 30 may be included in the semiconductor member 10M.

The nitride region 30 includes a first nitride portion 31. A direction from the sixth partial region 16 to the first nitride portion 31 is along the second direction D2. The first nitride portion 31 is in contact with the sixth partial region 16. A direction from the second semiconductor portion 22 to the first nitride portion 31 is along the first direction D1.

The first insulating member 41 includes a first insulating region 41a. The first insulating region 41a is between the third partial region 13 and the first electrode portion 53a in the second direction D2. In this example, the first insulating region 41a is between a part of the second semiconductor region 20 and the first electrode portion 53a in the second direction D2.

As shown in FIG. 1, the semiconductor device 110 may include a base body 18s and a nitride layer 18b. The nitride layer 18b is between the base body 18s and the first semiconductor region 10. The base body 18s may be, for example, a silicon substrate. The nitride layer 18b includes AlGaN and the like. The nitride layer 18b is, for example, a buffer layer. The nitride layer 18b is provided on the base body 18s. The semiconductor member 10M is provided on the nitride layer 18b. The first to third electrodes 51 to 53 are provided on the semiconductor member 10M.

A current flowing between the first electrode 51 and the second electrode 52 can be controlled by a potential of the third electrode 53. The potential of the third electrode 53 may be, for example, a potential based on a potential of the first electrode 51. The first electrode 51 functions as, for example, a source electrode. The second electrode 52 functions as, for example, a drain electrode. The third electrode 53 functions as, for example, a gate electrode. The first insulating region 41a functions as, for example, a gate insulating film. The semiconductor device 110 is, for example, a transistor.

A distance d1 along the first direction D1 between the first electrode 51 and the third electrode 53 is shorter than a distance d2 along the first direction D1 between the third electrode 53 and the second electrode 52. By the distance d2 being long, it is easy to obtain a high breakdown voltage.

A carrier region 10c is formed in a portion of the first semiconductor region 10 facing the second semiconductor region 20. The carrier region 10c is, for example, a two-dimensional electron gas. The semiconductor device 110 is, for example, HEMT (High Electron Mobility Transistor).

As described above, in the embodiment, the first nitride portion 31 having a high Al composition ratio is provided. As a result, the carrier concentration in the carrier region 10c can be locally increased in the region overlapping the first nitride portion 31.

In a semiconductor device, current collapse may occur, for example, the ON-resistance of the semiconductor device may fluctuate and increase. According to the study by the inventors of the present application, it has been found that the current collapse can be suppressed when the carrier concentration in the carrier region 10c is high. In the embodiment, the current collapse can be suppressed by providing the first nitride portion 31. For example, it is easy to obtain a stable ON-resistance.

On the other hand, according to the study by the inventors of the present application, it has been found that when the carrier concentration in the carrier region 10c is high in the vicinity of the third electrode 53 (for example, the gate electrode), the leakage current increases in the third electrode 53. In the embodiment, the second semiconductor portion 22 is provided in the vicinity of the third electrode 53. The Al composition ratio in the second semiconductor portion 22 is lower than the Al composition ratio in the first nitride portion 31. Therefore, in the region overlapping the second semiconductor portion 22, the carrier concentration in the carrier region 10c can be relatively low. The carrier concentration becomes low in the vicinity of the gate electrode (third electrode 53). As a result, the leakage current can be suppressed. Stable gate reliability can be obtained.

In the embodiment, the current collapse can be suppressed and stable characteristics can be obtained. Leakage current can be suppressed. According to the embodiment, a semiconductor device capable of stabilizing the characteristics can be provided.

As shown in FIG. 1, in this example, the semiconductor device 110 includes a first conductive member 61. The first conductive member 61 is electrically connected with one of the first electrode 51 and the third electrode 53. In this example, the first conductive member 61 is electrically connected with the first electrode 51.

A position of the third electrode 53 in the second direction D2 is between a position of the first semiconductor region 10 in the second direction D2 and a position of the first conductive member 61 in the second direction D2. For example, at least a part of the first conductive member 61 is provided above the third electrode 53.

The first conductive member 61 includes a first conductive member end portion 61*e* in the first direction D1. A position of the first conductive member end portion 61*e* in the first direction D1 is between a position of the third electrode 53 in the first direction D1 and a position of the second electrode 52 in the first direction D1. The first conductive member 61 protrudes toward the second electrode 52 with reference to the third electrode 53. The first conductive member 61 functions as, for example, a field plate.

The second semiconductor portion 22 includes a second semiconductor end portion 22*e* on the side of the first nitride portion 31. The second semiconductor end portion 22*e* faces the first nitride portion 31 in the first direction D1. For example, the second semiconductor end portion 22*e* is in contact with the first nitride portion 31. A position of the second semiconductor end portion 22*e* in the first direction D1 is between the position of the first conductive member end portion 61*e* in the first direction D1 and the position of the second electrode 52 in the first direction D1.

For example, the first conductive member end portion 61*e* overlaps the second semiconductor portion 22 in the second direction D2. By overlapping the first conductive member end portion 61*e* with the second semiconductor portion 22 having a low Al composition ratio, for example, destabilization of the characteristics due to the concentration of the electric field at the position corresponding to the first conductive member end portion 61*e* can be suppressed. For example, it is easy to obtain high breakdown voltage. Leakage current can be reduced.

For example, the first conductive member 61 does not overlap the first nitride portion 31 in the second direction D2. As a result, the current collapse can be suppressed more effectively. It is easy to obtain stable ON-resistance.

The semiconductor device 110 may further include a second conductive member 62. The second conductive member 62 is electrically connected with the other of the first electrode 51 and the third electrode 53. In this example, the second conductive member 62 is electrically connected with the third electrode 53. The second conductive member 62 may be electrically connected with the first electrode 51 without being electrically connected with the third electrode 53. The second conductive member 62 is between the third electrode 53 and the first conductive member 61 in the second direction D2. An insulating layer 55*a* may be provided between at least a part of the third electrode 53 and the second conductive member 62. An insulating layer 55*b* may be provided between the second conductive member 62 and the first conductive member 61. The second conductive member 62 functions as, for example, a field plate.

The second conductive member 62 includes, for example, a second conductive member end portion 62*e*. The second conductive member end portion 62*e* is an end portion in the first direction D1. A position of the second conductive member end portion 62*e* in the first direction D1 is between the position of the first electrode portion 53*a* in the first direction D1 and the position of the first conductive member end portion 61*e* in the first direction D1.

The semiconductor device 110 may include a third conductive member 63. The third conductive member 63 is electrically connected with the second electrode 52.

As shown in FIG. 1, a thickness of the second semiconductor portion 22 along the second direction D2 is defined as a first thickness t1. A thickness of the first nitride portion 31 along the second direction D2 is defined as a second thickness t2. The first thickness t1 is preferably thicker than the second thickness t2. The second thickness t2 is preferably thinner than the first thickness t1.

There is a large difference in lattice constant between the first semiconductor region 10 (for example, GaN) and the first nitride portion 31 (for example, AlN). If the second thickness t2 is excessively thick, the crystallinity may deteriorate due to the difference in lattice constant. As a result, the leakage current may increase. By the second thickness t2 being thin, good crystallinity can be easily obtained.

The second thickness t2 is preferably, for example, not less than 1 nm and not more than 10 nm. When the second thickness t2 is not less than 1 nm, for example, the first nitride portion 31 being uniform can be easily obtained. When the second thickness t2 is 10 nm or less, good crystallinity can be easily obtained in the first nitride portion 31, for example. Leakage current can be reduced.

The first thickness t1 is preferably, for example, not less than 20 nm and not more than 40 nm. When the first thickness t1 is 20 nm or more, for example, the carrier region 10*c* having good characteristics can be easily obtained. It is easy to obtain stable ON-resistance. When the first thickness t1 is 40 nm or less, for example, good crystallinity can be easily obtained. Leakage current can be reduced.

In the semiconductor device 110, the first electrode 51 is electrically connected with the first semiconductor portion 21. For example, the first electrode 51 may be in contact with the first semiconductor portion 21. For example, the first electrode 51 may be electrically connected with the first partial region 11. In the semiconductor device 110, the second electrode 52 may be electrically connected with the first nitride portion 31. The second electrode 52 may be electrically connected with the second partial region 12.

Figure 2:
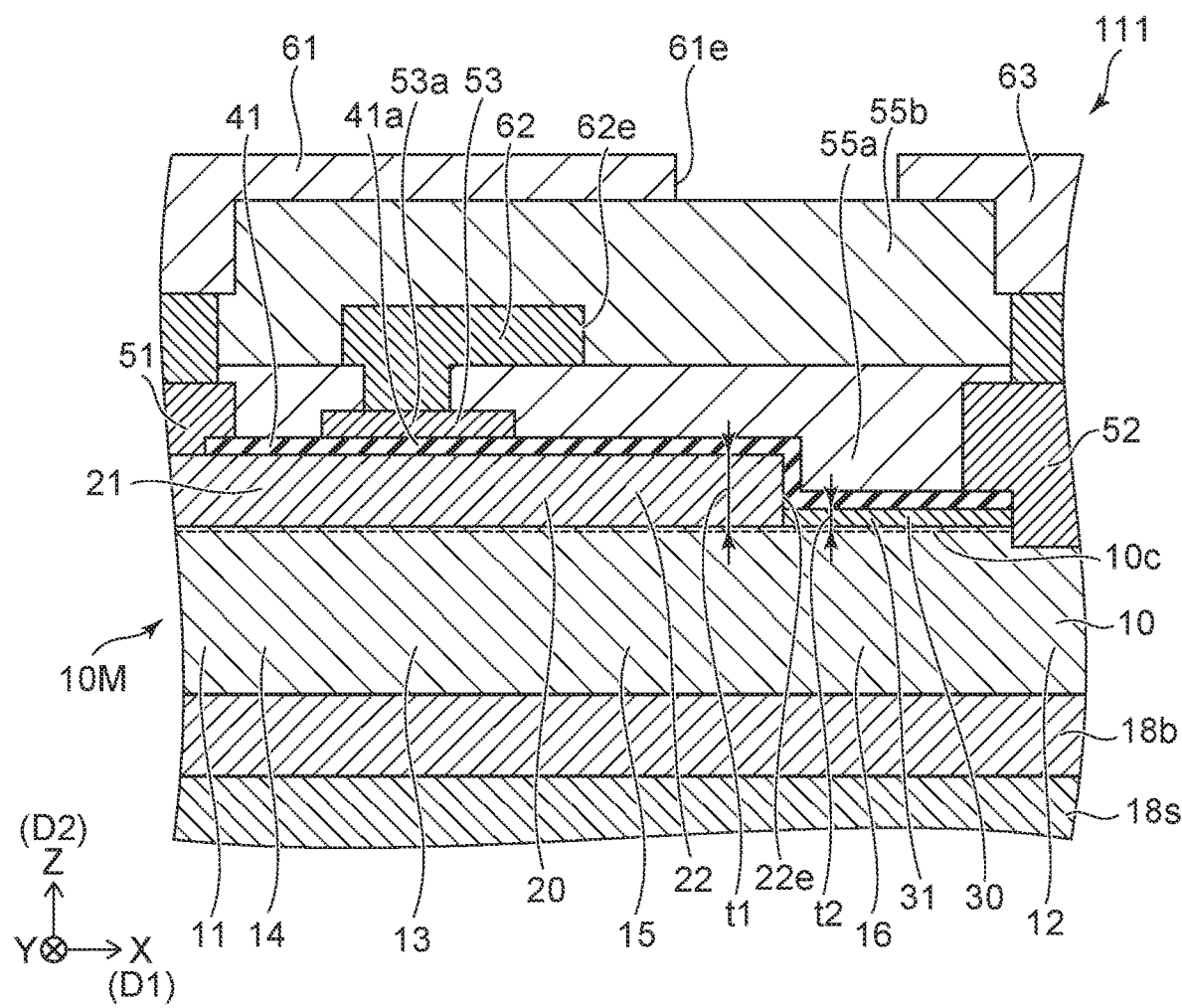
FIG. 2 is a schematic cross-sectional view illustrating a semiconductor device according to the first embodiment.

FIG. 2 is a schematic cross-sectional view illustrating a semiconductor device according to the first embodiment. As shown in FIG. 2, in a semiconductor device 111 according to the embodiment, the configuration of the second electrode 52 is different from the configuration of the second electrode 52 in the semiconductor device 110. Except for this, the configuration of the semiconductor device 111 may be the same as the configuration of the semiconductor device 110.

In the semiconductor device 111, the second electrode 52 is in contact with the second partial region 12. The contact resistance between the first nitride portion 31 having a high Al composition ratio and the second electrode 52 tends to be high. By contacting the second electrode 52 with the second partial region 12, for example, the contact resistance can be lowered. For example, stable contact resistance can be easily obtained. For example, the ON-resistance can be lowered.

Figure 3:
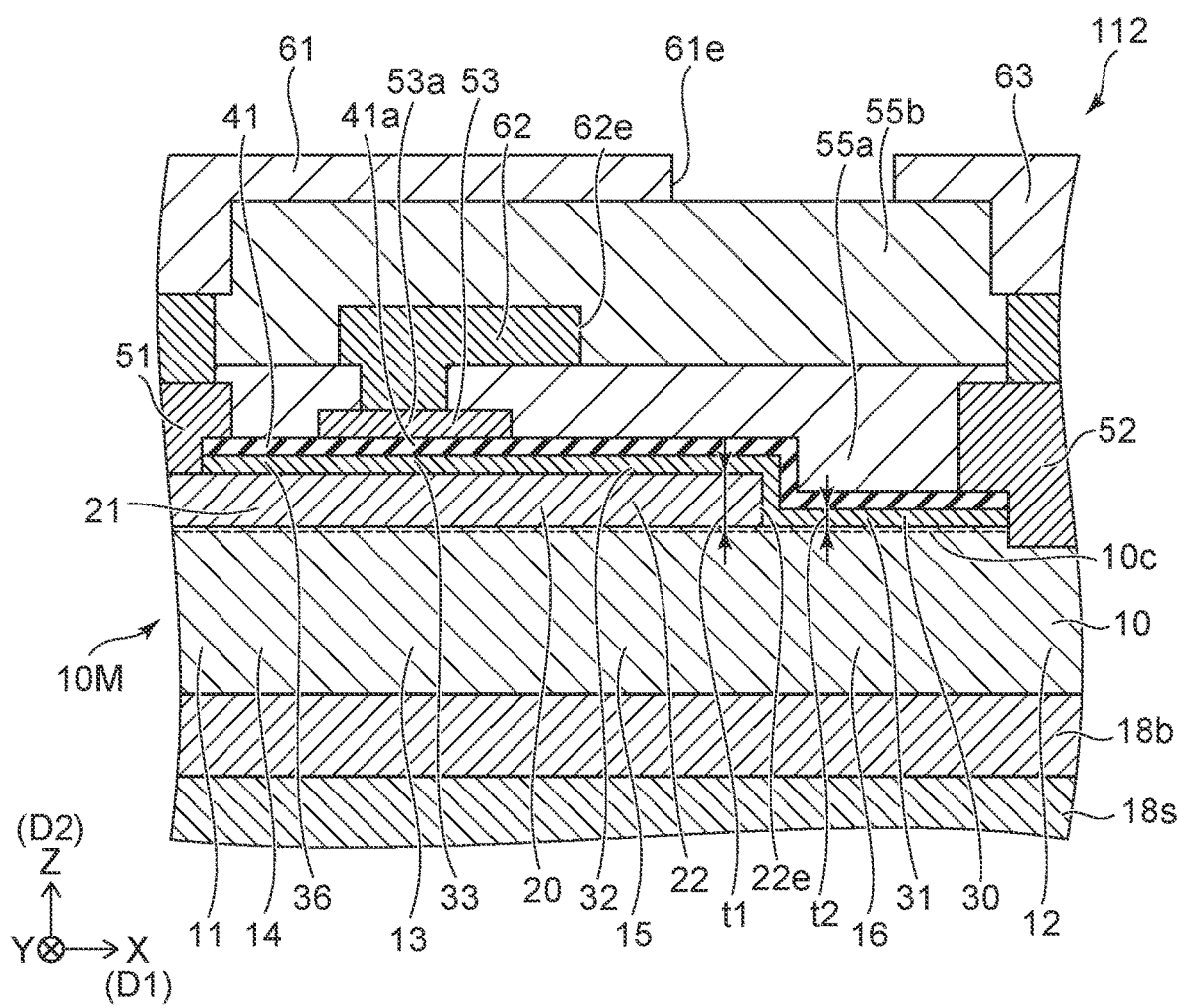
FIG. 3 is a schematic cross-sectional view illustrating a semiconductor device according to the first embodiment.

FIG. 3 is a schematic cross-sectional view illustrating a semiconductor device according to the first embodiment.

As shown in FIG. 3, in a semiconductor device 112 according to the embodiment, the configurations of the nitride region 30 and the first insulating member 41 are different from those configurations in the semiconductor device 110. Except for this, the configuration of the semiconductor device 112 may be the same as the configuration of the semiconductor device 110 or the semiconductor device 111.

As shown in FIG. 3, in the semiconductor device 112, the nitride region 30 further includes a second nitride portion 32. The second semiconductor portion 22 is between the fifth partial region 15 and the second nitride portion 32. In this way, a part of the nitride region 30 may be provided on the second semiconductor portion 22.

As shown in FIG. 3, the nitride region 30 may further include a third nitride portion 33. The third nitride portion 33 is between the third partial region 13 and the first insulating region 41a.

As shown in FIG. 3, the nitride region 30 may further include another portion (a sixth nitride portion 36). The first semiconductor portion 21 is between the fourth partial region 14 and the sixth nitride portion 36. The first nitride portion 31, the second nitride portion 32, the third nitride portion 33, and the sixth nitride portion 36 may be continuous with each other. The boundaries between these nitride portions may be clear or unclear.

The first insulating member 41 may include, for example, at least one selected from the group consisting of $SiO_2$, AlSiO, $Al_2O_3$, AlSiON, AlON, SiN, and SiON. The first insulating member 41 includes, for example, a silicon oxide film. High insulation is easy to obtain. For example, it is easy to obtain a stable threshold voltage.

Second Embodiment

Figure 4:
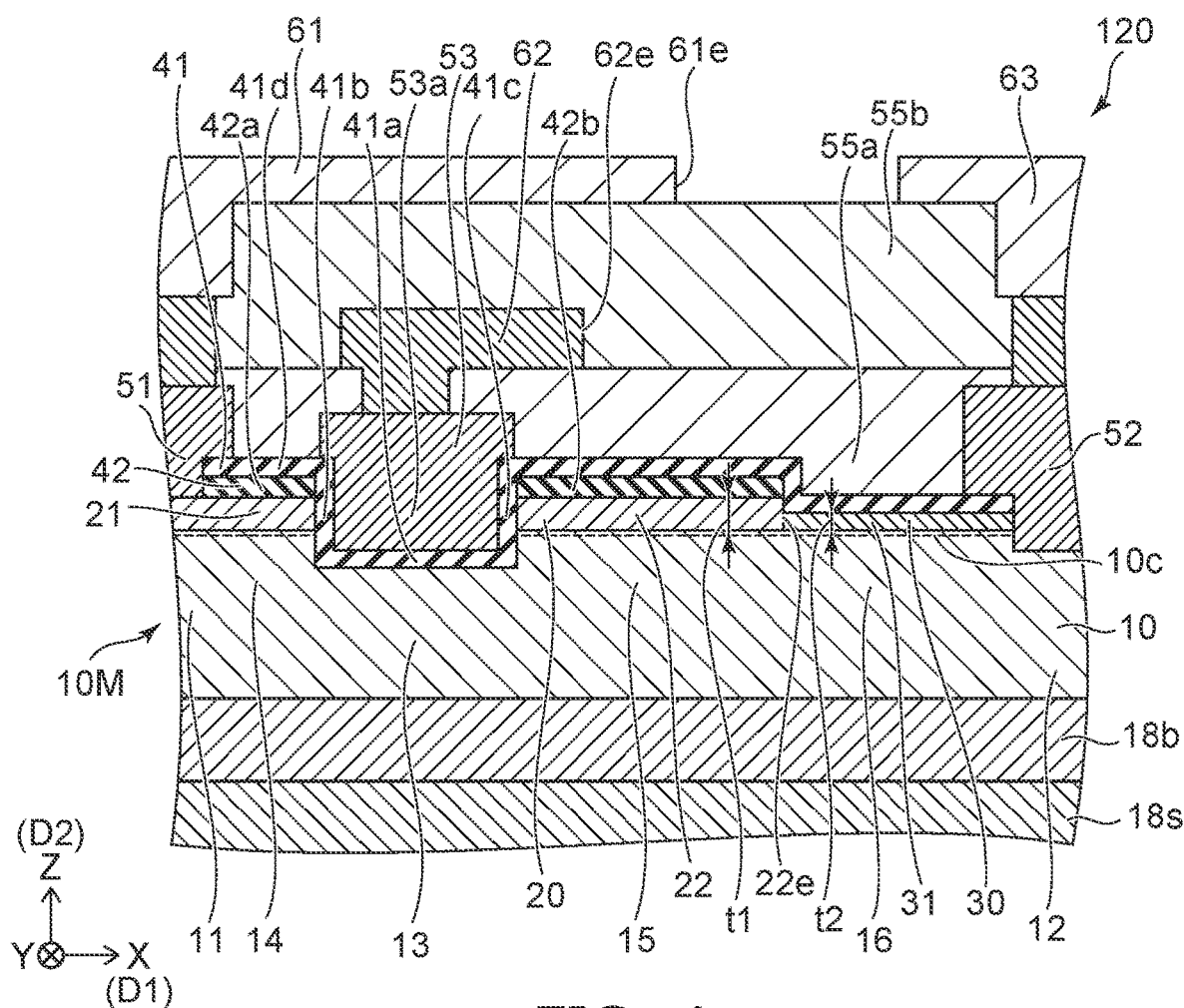
FIG. 4 is a schematic cross-sectional view illustrating a semiconductor device according to a second embodiment.

FIG. 4 is a schematic cross-sectional view illustrating a semiconductor device according to a second embodiment.

As shown in FIG. 4, in a semiconductor device 120 according to the embodiment, the configuration of the third electrode 53 is different from the configuration of the third electrode 53 in the semiconductor device 110. Except for this, the configuration of the semiconductor device 120 may be the same as the configuration of the semiconductor device 110 (or the semiconductor devices 111 and 112).

In the semiconductor device 120, for example, at least a part of the first electrode portion 53a of the third electrode 53 is between the fourth partial region 14 and the fifth partial region 15 in the first direction D1. For example, a part of the first electrode portion 53a is between the first semiconductor portion 21 and the second semiconductor portion 22 in the first direction D1.

The first insulating member 41 further includes a second insulating region 41b and a third insulating region 41c. The second insulating region 41b is between the first semiconductor portion 21 and a part of the first electrode portion 53a in the first direction D1. The third insulating region 41c is between a part of the first electrode portion 53a and the second semiconductor portion 22 in the first direction D1.

For example, at least a part of the first insulating region 41a is between the fourth partial region 14 and the fifth partial region 15 in the first direction D1.

In the semiconductor device 120, the third electrode 53 is a recess type gate electrode. With such a configuration, for example, a high threshold voltage can be obtained. For example, normal off characteristics can be obtained.

Even in the semiconductor device 120, current collapse can be suppressed and stable characteristics can be obtained. Leakage current can be suppressed. According to the embodiment, a semiconductor device capable of stabilizing the characteristics can be provided.

As shown in FIG. 4, the semiconductor device 120 may further include a second insulating member 42. For example, the second insulating member 42 may include a first insulating portion 42a and a second insulating portion 42b. The first semiconductor portion 21 is between the fourth partial region 14 and the first insulating portion 42a. The second semiconductor portion 22 is between the fifth partial region 15 and the second insulating portion 42b.

The second insulating member 42 functions as, for example, a protective film. By providing the second insulating member 42, for example, the current collapse can be reduced. For example, it is easy to obtain a stable ON-resistance.

The second insulating member 42 includes, for example, at least one selected from the group consisting of SiN and SiON. By the second insulating member 42 including nitrogen, for example, the second semiconductor region 20 being suitable can be easily obtained.

For example, the first insulating portion 42a may be provided between the first semiconductor portion 21 and a part of the first insulating member 41. For example, the second insulating portion 42b may be provided between the second semiconductor portion 22 and another part of the first insulating member 41.

The crystallinity of at least a part of the second insulating member 42 (for example, the first insulating portion 42a) may be lower than the crystallinity of the first semiconductor portion 21. The crystallinity of at least a part of the second insulating member 42 (for example, the second insulating portion 42b) may be lower than the crystallinity of the second semiconductor portion 22. For example, at least a part of the second insulating member 42 may be amorphous. The second semiconductor region 20 includes crystals.

Figure 5:
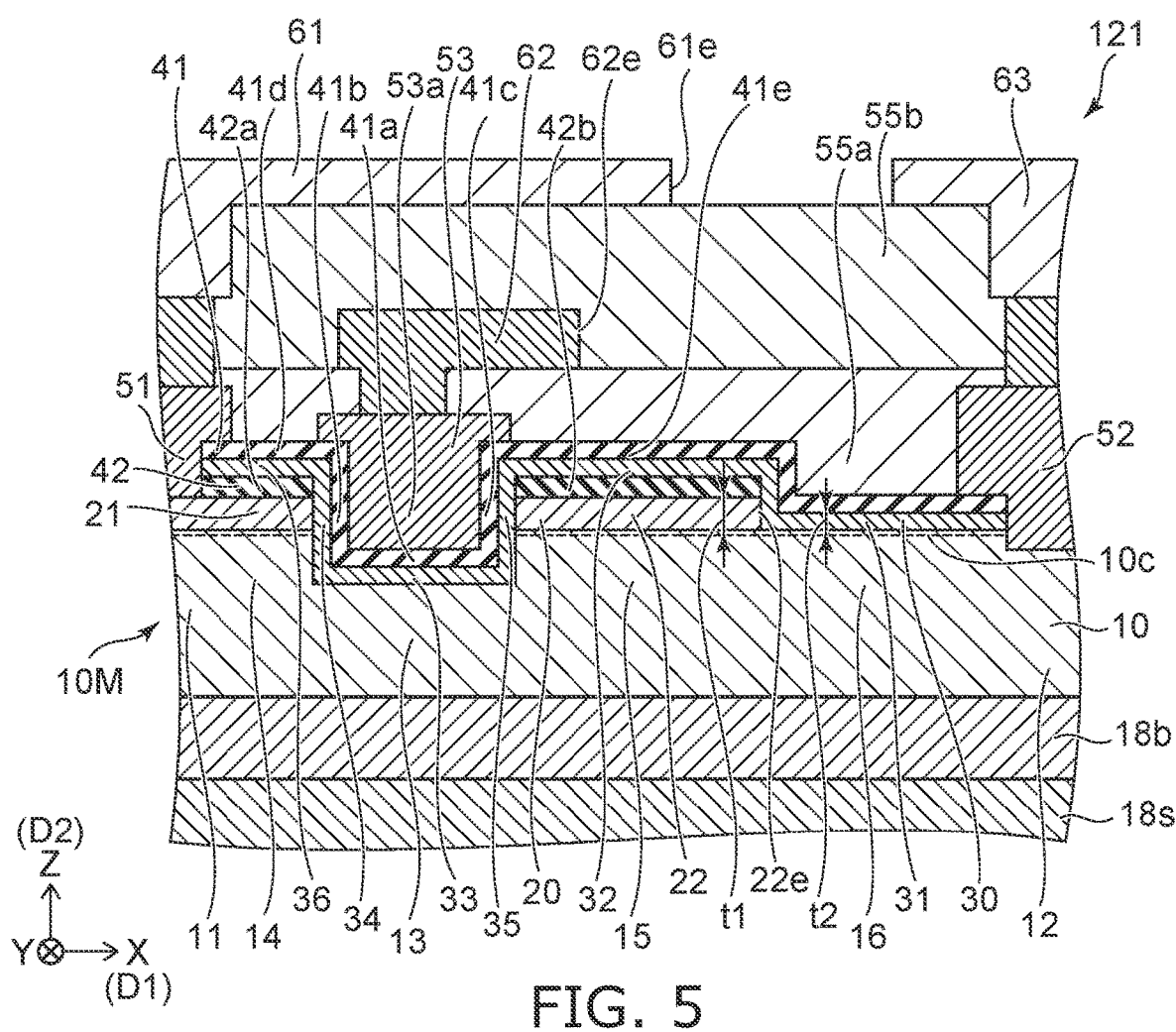
FIG. 5 is a schematic cross-sectional view illustrating a semiconductor device according to the second embodiment.

FIG. 5 is a schematic cross-sectional view illustrating a semiconductor device according to the second embodiment.

As shown in FIG. 5, in the semiconductor device 121 according to the embodiment, the configuration of the nitride region 30 is different from that in the semiconductor device 120. Except for this, the configuration of the semiconductor device 121 may be the same as the configuration of the semiconductor device 120.

In the semiconductor device 121, the nitride region 30 further includes a second nitride portion 32. The second semiconductor portion 22 is between the fifth partial region 15 and the second nitride portion 32 in the second direction D2.

The nitride region 30 may further include a third nitride portion 33. The third nitride portion 33 is between the third partial region 13 and the first insulating region 41a.

The nitride region 30 may further include a fourth nitride portion 34 and a fifth nitride portion 35. The fourth nitride portion 34 is between the first semiconductor portion 21 and the second insulating region 41b in the first direction D1. The fifth nitride portion 35 is between the third insulating region 41c and the second semiconductor portion 22 in the first direction D1.

The nitride region 30 may further include a sixth nitride portion 36. The first semiconductor portion 21 is between the fourth partial region 14 and the sixth nitride portion 36 in the second direction D2. The first to sixth nitride portions 31 to 36 may be continuous. The boundaries between the first to sixth nitride portions 31 to 36 may be clear or unclear.

In this example, the first insulating portion 42a is between the first semiconductor portion 21 and the sixth nitride portion 36. The second insulating portion 42b is between the second semiconductor portion 22 and the second nitride portion 32.

For example, the second nitride portion 32 and the sixth nitride portion 36 are provided on the first semiconductor portion 21 and the second semiconductor portion 22. The third to fifth nitride portions 33 to 35 are provided in the recess (for example, a trench) in which the third electrode 53 is provided. The thicknesses (lengths along the second direction D2) of the first nitride portion 31, the second nitride portion 32, the third nitride portion 33, and the sixth nitride portion 36 may be substantially the same as each other. The thickness of each of the fourth nitride portion 34 and the fifth nitride portion 35 (the length along the first direction D1) may be substantially the same as the thickness of the first nitride portion 31 (second thickness t2).

The first insulating member 41 may include a fourth insulating region 41d and a fifth insulating region 41e. The sixth nitride portion 36 is between the first insulating portion 42a and the fourth insulating region 41d. The second nitride portion 32 is between the second insulating portion 42b and a part of the fifth insulating region 41e. The second nitride portion 32 is between the second semiconductor portion 22 and a part of the fifth insulating region 41e in the second direction D2. The first nitride portion 31 is between the sixth partial region 16 and another portion of the fifth insulating region 41e.

In the semiconductor device 121, the crystallinity of at least a part of the second insulating member 42 is lower than the crystallinity of the second semiconductor portion 22. The second insulating member 42 is, for example, amorphous.

For example, the second nitride portion 32 is provided on the second insulating member 42 (second insulating portion 42b) having low crystallinity (for example, amorphous). At least a part of such a second nitride portion 32 may be amorphous, for example. By at least a part of the second nitride portion 32 being amorphous, stable characteristics can be obtained. For example, the leakage current can be reduced. The crystallinity of the second nitride portion 32 may be lower than the crystallinity of the first nitride portion 31. The first nitride portion 31 includes, for example, a crystal. The carrier region 10c being suitable is obtained.

FIG. 6A to FIG. 6D and FIG. 7A to FIG. 7D are schematic cross-sectional views illustrating a method for manufacturing the semiconductor device according to the embodiment.

Figure 6A:
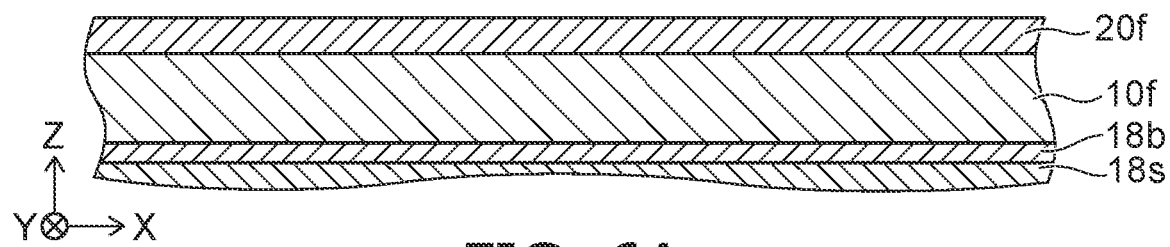
FIG. 6A to FIG. 6D are schematic cross-sectional views illustrating a method for manufacturing the semiconductor device according to the embodiment.

As shown in FIG. 6A, a semiconductor film 10f serving as the first semiconductor region 10 is formed on the nitride layer 18b provided on the base body 18s. A semiconductor film 20f serving as a second semiconductor region 20 is formed on the semiconductor film 10f. These semiconductor films are formed, for example, by epitaxial growth.

Figure 6B:
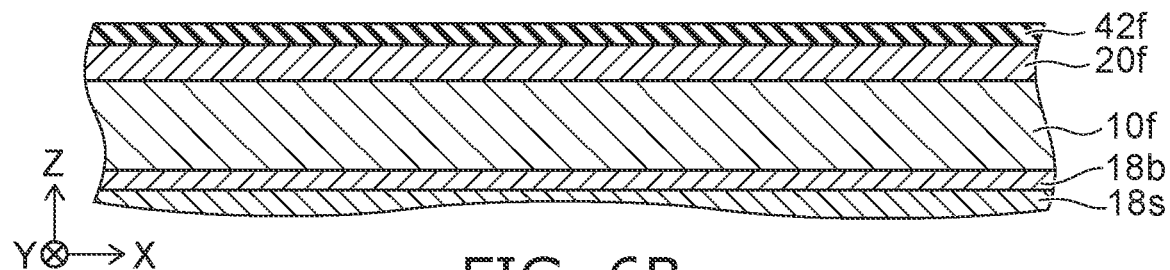

As shown in FIG. 6B, an insulating film 42f serving as a second insulating member 42 is formed. The insulating film 42f is, for example, a SiN film.

Figure 6C:
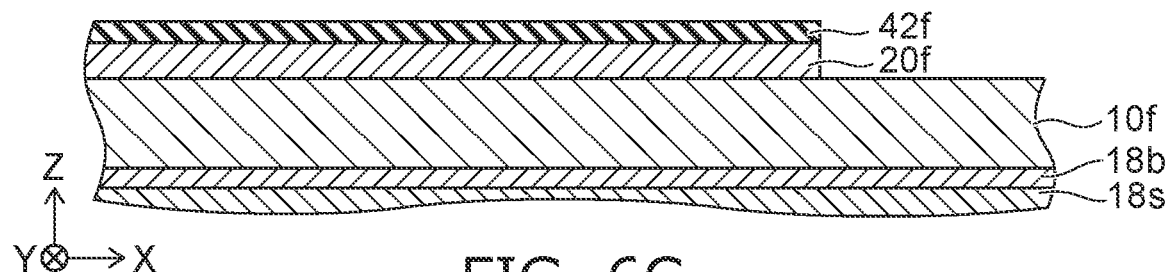

As shown in FIG. 6C, a part of the insulating film 42f and a part of the semiconductor film 20f are removed. A part of the semiconductor film 10f is exposed. At this time, a part of the semiconductor film 10f may be removed. The removal is performed, for example, by etching with a fluorine-based gas and a chlorine-based gas. Chemical treatment may be performed after etching. For example, a damage is removed. For the chemical treatment, for example, an alkaline solution (for example, a solution including tetramethylammonium hydroxide) may be used. After etching, high temperature treatment may be performed. The high temperature treatment is carried out, for example, in an atmosphere of a gas including at least one of nitrogen, ammonia and hydrogen.

Figure 6D:
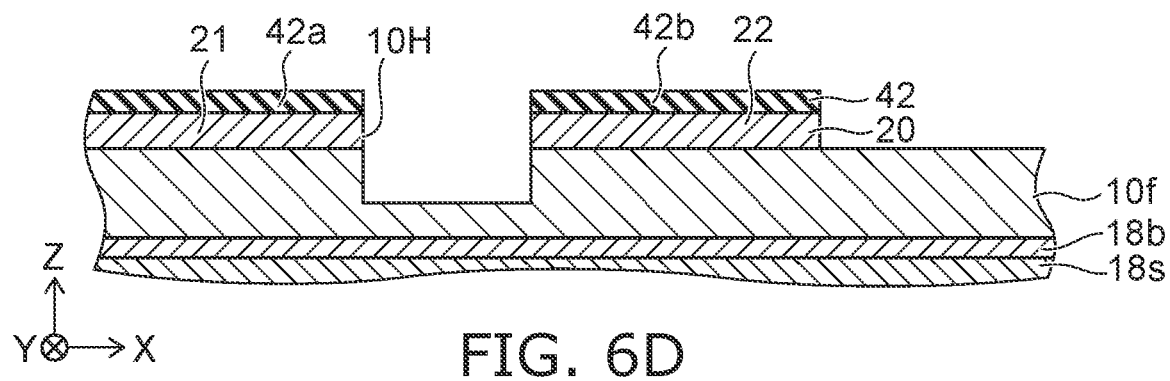

As shown in FIG. 6D, another part of the insulating film 42f, another part of the semiconductor film 20f, and a part of the semiconductor film 10f are removed. As a result, a recess 10H is formed. The recess 10H corresponds to, for example, a hole or a trench. A second insulating member 42 including the first insulating portion 42a and the second insulating portion 42b is formed from the insulating film 42f. A second semiconductor region 20 including the first semiconductor portion 21 and the second semiconductor portion 22 is formed from the semiconductor film 20f.

Figure 7A:
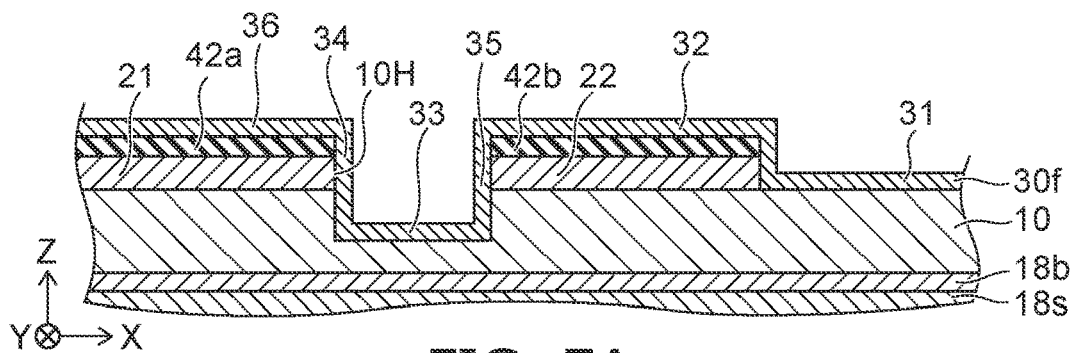
FIG. 7A to FIG. 7D are schematic cross-sectional views illustrating the method for manufacturing the semiconductor device according to the embodiment.

As shown in FIG. 7A, a nitride film 30f serving as the nitride region 30 is formed. The nitride film 30f includes portions to be the first to sixth nitride portions 31 to 36. For example, the first nitride portion 31, the third nitride portion 33, the fourth nitride portion 34, and the fifth nitride portion 35 include crystals. For example, the second nitride portion 32 and the sixth nitride portion 36 include an amorphous portion.

Figure 7B:
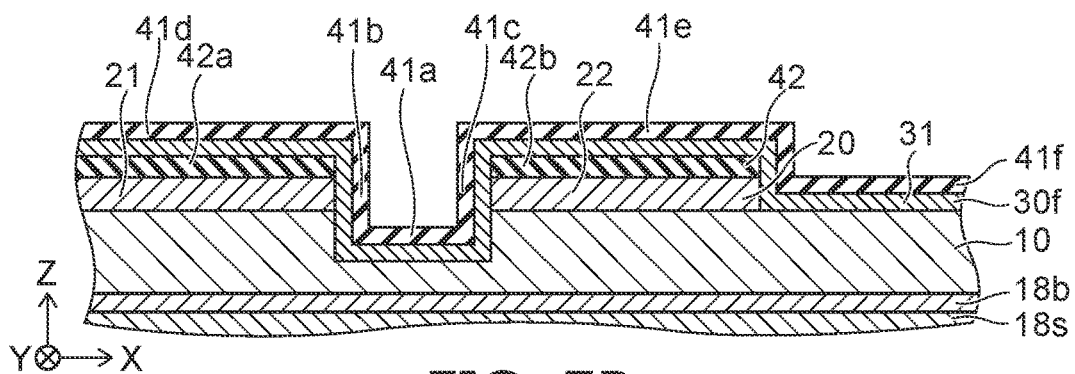

As shown in FIG. 7B, an insulating film 41f serving as the first insulating member 41 is formed on the nitride film 30f. The insulating film 41f may be, for example, a $SiO_2$ film. The insulating film 41f includes, for example, a portion to be the first to fifth insulating regions 41a to 41e.

Figure 7C:
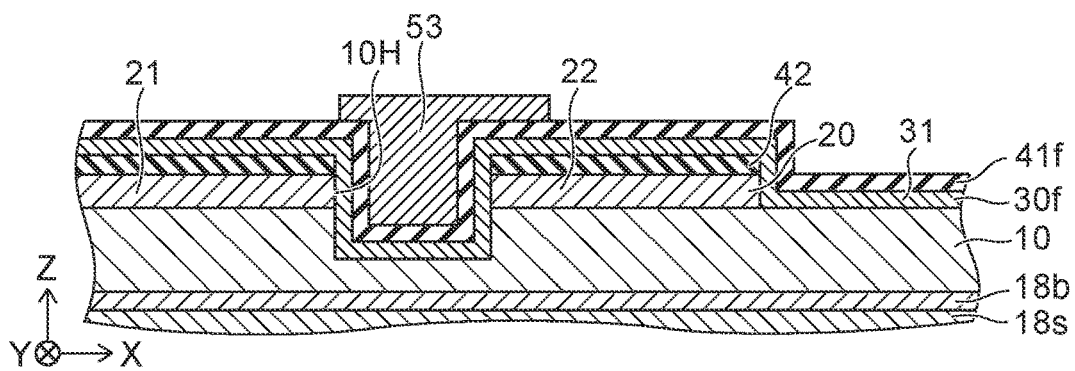

As shown in FIG. 7C, the third electrode 53 is formed by embedding the conductive material in the remaining space in the recess 10H.

Figure 7D:
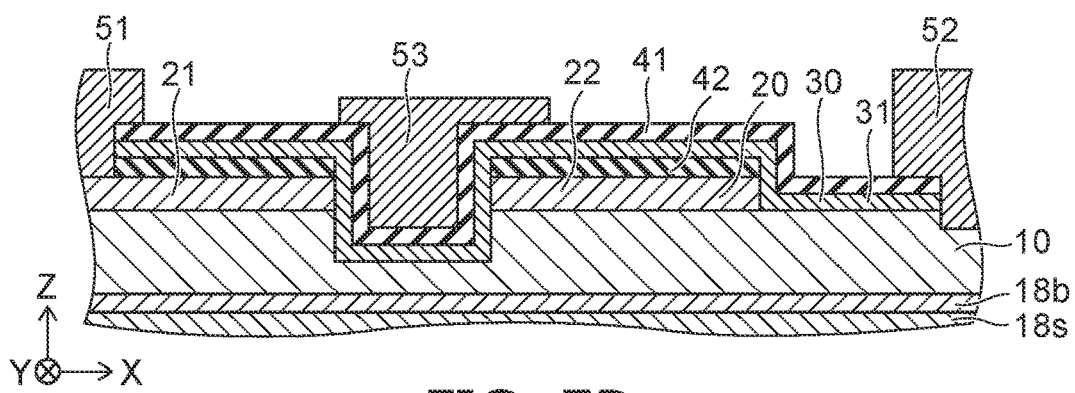

As shown in FIG. 7D, a part of the nitride film 30f, a part of the insulating film 41f, and a part of the insulating film 42f are removed. By the removal, a part of the first semiconductor portion 21 is exposed. Another part of the nitride film 30f and another part of the insulating film 41f are removed. By the removal, a part of the first semiconductor region 10 (second partial region 12) is exposed. By forming the conductive member in the two exposed regions, the first electrode 51 and the second electrode 52 are formed.

After that, the first to third conductive members 61 to 63 are formed as needed. As a result, the semiconductor device according to the embodiment can be formed.

According to the manufacturing method according to the embodiment, a semiconductor device whose characteristics can be improved can be obtained.

The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 includes, for example, at least one selected from the group consisting of TiN, WN, Ni, Au, Pt and Ti. The first to third conductive members 61 to 63 include, for example, a metal. The metal included in the first conductive member 61 includes, for example, at least one selected from the group consisting of aluminum, copper and gold. The third electrode 53 and the first to third conductive members to 63 may include, for example, conductive silicon or conductive polysilicon.

Information on the thickness can be obtained by observing with an electron microscope. Information on the composition can be obtained by SIMS (Secondary Ion Mass Spectrometry) or EDX (Energy dispersive X-ray spectroscopy).

According to the embodiment, it is possible to provide a semiconductor device capable of stabilizing the characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode, a direction from the first electrode to the second electrode being along a first direction;
   a third electrode including a first electrode portion, a position of the first electrode portion in the first direction being between a position of the first electrode in the first direction and a position of the second electrode in the first direction;
   a first semiconductor region including $Al_{x1}Ga_{1-x1}N$ ($0 \leq x1 < 1$), the first semiconductor region including a first partial region, a second partial region, a third partial region, a fourth partial region, a fifth partial region, and a sixth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fifth partial region in the first direction and the position of the second partial region in the first direction;
   a second semiconductor region including $Al_{x2}Ga_{1-x2}N$ ($x1 < x2 < 1$), the second semiconductor region including a first semiconductor portion, and a second semiconductor portion, a direction from the fourth partial region to the first semiconductor portion being along the second direction, a direction from the fifth partial region to the second semiconductor portion being along the second direction, the second semiconductor portion being in contact with the fifth partial region;
   a nitride region including $Al_{y1}Ga_{1-y1}N$ ($x2 < y1 \leq 1$), the nitride region including a first nitride portion, a direction from the sixth partial region to the first nitride portion being along the second direction, the first nitride portion being in direct contact with the sixth partial region, a direction from the second semiconductor portion to the first nitride portion being along the first direction; and
   a first insulating member including a first insulating region, the first insulating region being between the third partial region and the first electrode portion in the second direction,
   wherein
   a first thickness of the second semiconductor portion along the second direction is thicker than a second thickness of the first nitride portion along the second direction,
   the first electrode physically contacts the first semiconductor portion, and
   the second electrode is electrically connected to the first nitride portion.

2. The device according to claim 1, further comprising a first conductive member electrically connected with one of the first electrode and the third electrode,
   a position of the third electrode in the second direction being between a position of the first semiconductor region in the second direction and a position of the first conductive member in the second direction,
   the first conductive member including a first conductive member end portion in the first direction,
   a position of the first conductive member end portion in the first direction is between a position of the third electrode in the first direction and the position of the second electrode in the first direction,
   the second semiconductor portion including a second semiconductor end portion on a side of the first nitride portion,
   a position of the second semiconductor end portion in the first direction is between the position of the first conductive member end portion in the first direction and the position of the second electrode in the first direction.

3. The device according to claim 1, wherein the first thickness is not less than 20 nm and not more than 40 nm.

4. The device according to claim 1, wherein the second thickness is not less than 1 nm and not more than 10 nm.

5. The device according to claim 1, wherein the second electrode is in contact with the second partial region.

6. The device according to claim 1, wherein
   the nitride region further includes a second nitride portion,
   the second semiconductor portion is between the fifth partial region and the second nitride portion.

7. The device according to claim 1, wherein
   the nitride region further includes a third nitride portion,
   the third nitride portion is between the third partial region and the first insulating region.

8. The device according to claim 7, wherein
   the nitride region further includes a second nitride portion,
   the second semiconductor portion is between the fifth partial region and the second nitride portion.

9. The device according to claim 8, wherein a crystallinity of the second nitride portion is lower than a crystallinity of the first nitride portion.

10. The device according to claim 8, wherein
the first insulating member further includes a fifth insulating region, and
the second nitride portion is between the second semiconductor portion and the fifth insulating region in the second direction.

11. The device according to claim 8, further comprising a second insulating member,
at least a part of the second insulating member being between the second semiconductor portion and the second nitride portion.

12. The device according to claim 11, wherein a crystallinity of the at least the part of the second insulating member is lower than a crystallinity of the second semiconductor portion.

13. The device according to claim 1, wherein at least a part of the first insulating region is between the fourth partial region and the fifth partial region in the first direction.

14. The device according to claim 1, wherein a least a part of the first electrode portion is between the fourth partial region and the fifth partial region in the first direction.

15. The device according to claim 1, wherein a part of the first electrode portion is between the first semiconductor portion and the second semiconductor portion in the first direction.

16. The device according to claim 15, wherein
the first insulating member further includes a second insulating region and a third insulating region,
the second insulating region is between the first semiconductor portion and the first electrode portion in the first direction, and
the third insulating region is between the part of the first electrode portion and the second semiconductor portion in the first direction.

17. The device according to claim 16, wherein
the nitride region further includes a fourth nitride portion and a fifth nitride portion,
the fourth nitride portion is between the first semiconductor portion and the second insulating region in the first direction, and
the fifth nitride portion is between the third insulating region and the second semiconductor portion in the first direction.

18. The device according to claim 15, wherein
the nitride region further includes a third nitride portion,
the third nitride portion is between the third partial region and the first insulating region.

19. The device according to claim 1, wherein a distance between the first electrode and the third electrode along the first direction is shorter than a distance between the third electrode and the second electrode along the first direction.

20. A semiconductor device, comprising:
a first electrode;
a second electrode, a direction from the first electrode to the second electrode being along a first direction;
a third electrode including a first electrode portion, a position of the first electrode portion in the first direction being between a position of the first electrode in the first direction and a position of the second electrode in the first direction;
a first semiconductor region including $Al_{x1}Ga_{1-x1}N$ ($0 \leq x1 < 1$), the first semiconductor region including a first partial region, a second partial region, a third partial region, a fourth partial region, a fifth partial region, and a sixth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fifth partial region in the first direction and the position of the second partial region in the first direction;
a second semiconductor region including $Al_{x2}Ga_{1-x2}N$ ($x1 < x2 < 1$), the second semiconductor region including a first semiconductor portion, and a second semiconductor portion, a direction from the fourth partial region to the first semiconductor portion being along the second direction, a direction from the fifth partial region to the second semiconductor portion being along the second direction, the second semiconductor portion being in contact with the fifth partial region;
a nitride region including $Al_{y1}Ga_{1-y1}N$ ($x2 < y1 \leq 1$), the nitride region including a first nitride portion, a direction from the sixth partial region to the first nitride portion being along the second direction, the first nitride portion being in contact with the sixth partial region, a direction from the second semiconductor portion to the first nitride portion being along the first direction; and
a first insulating member including a first insulating region, the first insulating region being between the third partial region and the first electrode portion in the second direction,
wherein
the nitride region further includes a second nitride portion and a third nitride portion,
the third nitride portion is between the third partial region and the first insulating region,
the second semiconductor portion is between the fifth partial region and the second nitride portion, and
a crystallinity of the second nitride portion is lower than a crystallinity of the first nitride portion.

21. A semiconductor device, comprising:
a first electrode;
a second electrode, a direction from the first electrode to the second electrode being along a first direction;
a third electrode including a first electrode portion, a position of the first electrode portion in the first direction being between a position of the first electrode in the first direction and a position of the second electrode in the first direction;
a first semiconductor region including $Al_{x1}Ga_{1-x1}N$ ($0 \leq x1 < 1$), the first semiconductor region including a first partial region, a second partial region, a third partial region, a fourth partial region, a fifth partial region, and a sixth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction, a position of the sixth partial region in the first direction being between the position of the fifth partial region in the first direction and the position of the second partial region in the first direction;

a second semiconductor region including $Al_{x2}Ga_{1-x2}N$ (x1<x2<1), the second semiconductor region including a first semiconductor portion, and a second semiconductor portion, a direction from the fourth partial region to the first semiconductor portion being along the second direction, a direction from the fifth partial region to the second semiconductor portion being along the second direction, the second semiconductor portion being in contact with the fifth partial region;

a nitride region including $Al_{y1}Ga_{1-y1}N$ (x2<y1≤1), the nitride region including a first nitride portion, a direction from the sixth partial region to the first nitride portion being along the second direction, the first nitride portion being in contact with the sixth partial region, a direction from the second semiconductor portion to the first nitride portion being along the first direction;

a first insulating member including a first insulating region, the first insulating region being between the third partial region and the first electrode portion in the second direction; and a second insulating member, wherein the nitride region further includes a second nitride portion and a third nitride portion, the third nitride portion is between the third partial region and the first insulating region, the second semiconductor portion is between the fifth partial region and the second nitride portion, at least a part of the second insulating member is between the second semiconductor portion and the second nitride portion, a crystallinity of the at least the part of the second insulating member is lower than a crystallinity of the second semiconductor portion.

* * * * *